United States Patent [19]

Kaw

[11] Patent Number: 5,021,869
[45] Date of Patent: Jun. 4, 1991

[54] MONOLITHIC SEMICONDUCTOR CHIP INTERCONNECTION TECHNIQUE AND ARRANGEMENT

[75] Inventor: Ravindhar K. Kaw, San Jose, Calif.

[73] Assignee: Hewlett-Packard Company, Palo Alto, Calif.

[21] Appl. No.: 290,496

[22] Filed: Dec. 27, 1988

[51] Int. Cl.⁵ .................... H01L 23/12; H01L 25/08; H01L 25/12
[52] U.S. Cl. ........................................ 357/75; 357/71; 357/68
[58] Field of Search ...................... 357/75, 80, 68, 59, 357/71

[56] References Cited

U.S. PATENT DOCUMENTS

| | | | |
|---|---|---|---|
| 4,021,838 | 5/1977 | Warwick | 387/75 |
| 4,074,342 | 2/1978 | Honn et al. | 357/80 |
| 4,818,728 | 4/1989 | Rai et al. | 357/80 |

Primary Examiner—Rolf Hille
Assistant Examiner—S. V. Clark
Attorney, Agent, or Firm—Robert P. Sabath

[57] ABSTRACT

An interconnection arrangement and technique for a single semiconductor chip containing incomplete electric circuitry and having electric surface terminations permitting said incomplete electric circuitry to be externally interconnected, the interconnection arrangement being mountable on the semiconductor chip and capable of electically communicating with the semiconductor chip through electric surface terminations on the top surface of the semiconductor chip and on the bottom surface of the interconnection arrangement.

4 Claims, 2 Drawing Sheets

MONOLITHIC SEMICONDUCTOR CHIP INTERCONNECTION TECHNIQUE AND ARRANGEMENT

TECHNICAL FIELD

The technical field of this invention is that of techniques and arrangements for completing electric circuits and systems of circuits in a single semiconductor chip, and particularly that of techniques and arrangements for establishing intra-chip connections between incomplete portions of electric circuits and systems fabricated on a single semiconductor chip.

BACKGROUND

Semiconductor chips permit the microfabrication of electric circuits and systems of circuits (including subcircuits, portions of circuits, circuit elements, and components of circuits) on a single monolithic substrate containing an ever increasing density of circuits and systems. With an increase in the functionality of semiconductor chips, over recent years, the available surface area of semiconductor chips, remaining for interconnections to be made, is thus increasingly crowded.

In part to relieve this crowding, semiconductor chip size has increased dramatically. Nonetheless, despite the increase in chip size, an unacceptably increased percentage of total chip "real estate" is now devoted to intra-chip interconnection of circuits and systems on the surface of the same semiconductor chip which is to carry the completed electric circuits and/or circuit systems.

One solution, albeit a not comprehensively successful approach, to the problem of crowding in semiconductor chips has been to increase the number of metal layers on semiconductor chips. With increased layers, the total chip real estate available to accomplish interconnections is increased substantially, in fact up to a multiple of integer values equal to the total number of layers selected to enhance the interconnection capabilities of the semiconductor chip. Each such film layer is, for example, on the order of one or two microns thick. However, there is a limit to the number of such metal layers that can effectively be fabricated on a single semiconductor chip. For example, fabrication of more than two or three superimposed metal layers with insulative layers or regions interposed therebetween during the wafer stage of manufacture has been known to cause unacceptable levels of increased wafer bow, thereby effectively reducing wafer yield.

Reducing the line width of conductive leads or providing additional area for interconnections, on the other hand, either increases conductive line resistance or consumes additional space which would otherwise desirably be allocated for use as a site of functional circuitry. Increased line resistance is caused by reducing interconnection line width and this of course reduces the speed of the semiconductor chip and requires stronger circuit drivers to be employed to drive the circuitry and systems on the semiconductor chip. This in turn increases power losses and makes the semiconductor chip run hotter than desired, which thus makes the chip useless for many applications or makes it necessary to provide elaborate heat removal features to the arrangement in which the chip is integrated. It is clear that the task of optimizing interconnection schemes for the semiconductor chip actually containing electric circuits and systems of circuits faces ever increasing obstacles.

It is accordingly an object of the invention to establish an interconnection arrangement and technique for interconnecting incomplete circuits, subcircuits, portions of circuits, and/or circuit elements and components on a single semiconductor chip, which interconnection arrangement is structurally monolithic, independent of, and separable from the semiconductor chip requiring interconnection.

It is another object of the invention to establish an interconnection arrangement for circuits, subcircuits, portions of circuits, and/or circuit elements and components fabricated on a single semiconductor chip, which arrangement is mountable on the semiconductor chip containing the circuitry to be interconnected.

It is another object of the invention to reduce the interconnection path lengths between circuits, subcircuits, portions of circuits, and circuit elements and components on a single semiconductor chip, whereby the amount of power lost in circuit operations and the amount of heat generated are reduced.

It is a further object of the invention to establish an interconnection arrangement for a single semiconductor chip containing incomplete electric circuits or systems of circuits, which relieves circuit crowding on the semiconductor chip and which accomplishes external, i.e., extra-chip interconnection to close gaps in circuits or systems of circuits on the chip with a monolithic, layered arrangement of conductive and insulative layers of material.

SUMMARY OF THE INVENTION

The invention herein is accordingly directed toward a layered, monolithic, semiconductor chip interconnection technique and arrangement adapted for interconnection of incomplete electric circuits, subcircuits, portions of circuits, circuit elements, and circuit components fabricated in a single semiconductor chip. The interconnection arrangement is surface mounted with solder bumps on the top surface of the semiconductor chip to be interconnected, establishing electrical connections between selected electric surface terminations at the respective top and bottom surfaces of the semiconductor chip and the interconnection arrangement.

The interconnection technique includes establishing a predetermined scheme of electrically conductive paths on a selected substrate on which a plurality of conductive and insulative layers of material are fabricated in accordance with a predetermined interconnection scheme. This establishes a desired interconnection scheme which is effective to interconnect selected ones of the incomplete electric circuits and systems of circuits in the semiconductor chip, and electrically to close any gaps between portions of selected circuits on the chip. The monolithic interconnection arrangement is further particularly adapted to be solder mountable at predetermined electric surface termination pads on the semiconductor chip which is to be interconnected. Electric surface termination pads immediately adjacent to the edges of perimeter of the semiconductor chip are preferably reserved for making connection with other semiconductor chips. Such electric surface termination pads are typically not used for interconnections within the single semiconductor chip. However, according to the invention, any electrical top surface termination in a selected semiconductor chip can be interconnected as contemplated in the invention herein.

Interconnection arrangements according to this invention need of course not operate in conjunction with each and every top surface termination fabricated into the semiconductor chip to be interconnected. A selected number of the top surface terminations may suffice to accomplish interconnection of particular circuits or subcircuits as desired. Further, the electric terminations in the bottom surface of the interconnection arrangement are cooperatively patterned to be arranged in cooperation with the electric surface terminations on the top surface of the semiconductor chip subject to interconnection. This permits electrical communication between the interconnection arrangement and the semiconductor chip, which is effective for establishing selected interconnection schemes for electric circuits and systems of circuits in the semiconductor chip as desired.

DETAILED DESCRIPTION OF A PREFERRED EMBODIMENT OF THE INVENTION

Figure 1:
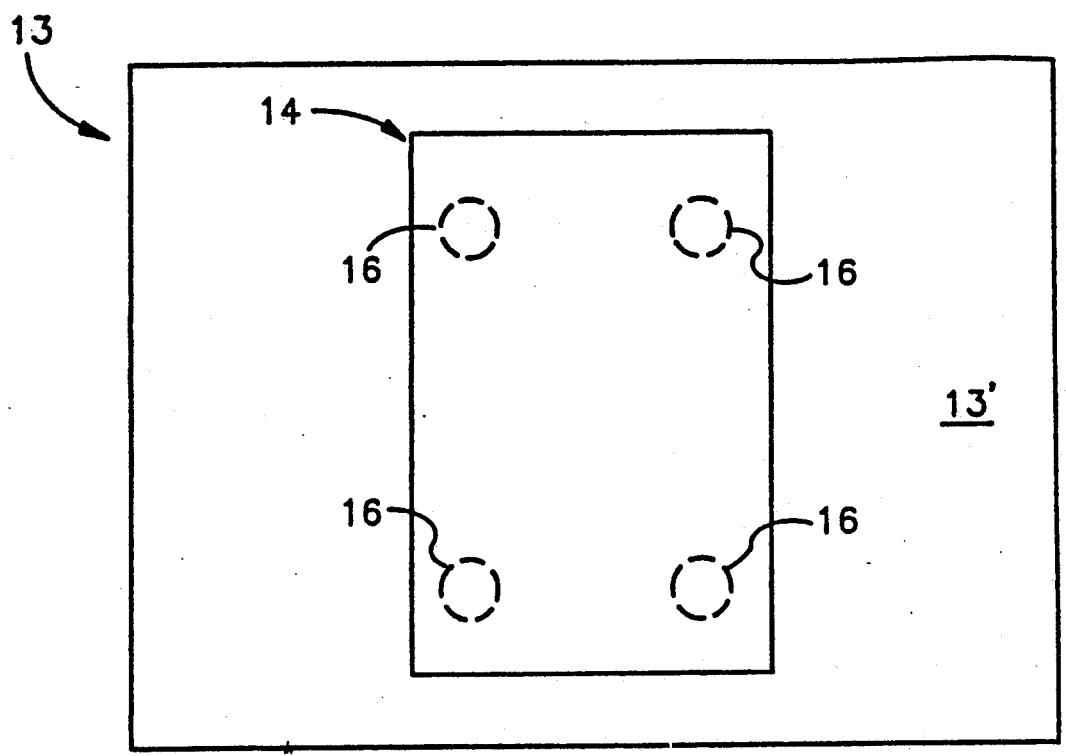
FIG. 1 shows an interconnection arrangement in top plan view mounted over a semiconductor chip containing incomplete circuits and systems subject to interconnection, according to the invention herein.
Figure 2:
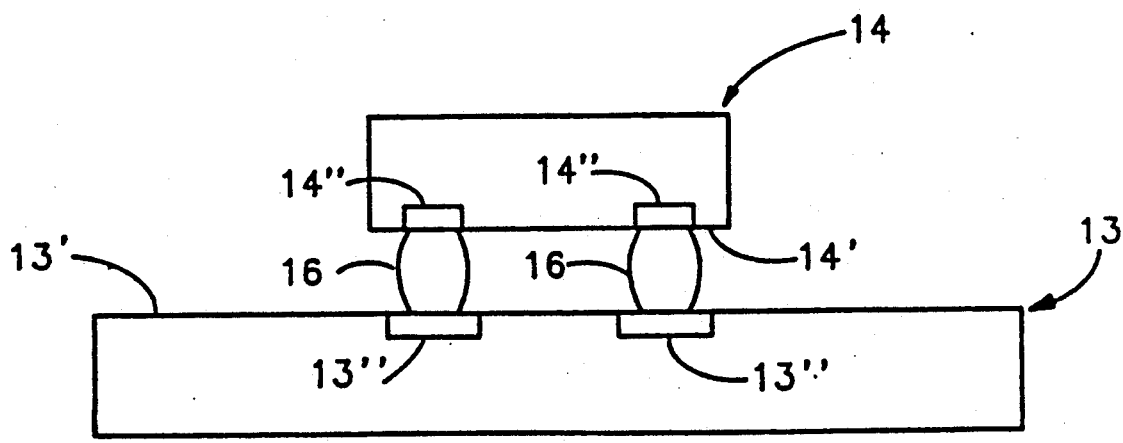
FIG. 2 shows a detailed side view of the interconnection arrangement of the invention, mounted over a semiconductor chip having incomplete circuits and systems subject to interconnection.

FIGS. 1 and 2 show a semiconductor chip 13 and a monolithic interconnection arrangement 14 according to the invention herein, respectively electrically connected at electric surface terminations 13" and 14", with electrically conductive solder bumps 16. As shown in FIG. 2, monolithic interconnection arrangement 14 includes a bottom surface 14', and semiconductor chip 13 includes a top surface 13'. The electric surface terminations 14" of monolithic interconnection arrangement 14 are thus electrically connected with semiconductor chip 13 through solder bumps 16 and with a selected interconnection scheme defined within monolithic interconnection arrangement 14, which is shown in FIG. 3 and which will be discussed in detail below.

Semiconductor chip 13 shown in FIGS. 1 and 2 includes a substantially flat top surface 13' having electric surface terminations 13" fabricated in top surface 13'. The electric surface terminations 13" in the top surface 13' of semiconductor chip 13 are particularly shown in detail in FIG. 2. These terminations 13" are electrically connected across gaps in electric circuits or systems of circuits within semiconductor chip 13. These gaps render the particular electric circuits or systems of circuits in which they occur functionally incomplete. The gaps in these circuits or systems where intentionally fabricated in order to save space in the semiconductor ship 13, which would otherwise have been dedicated to rendering the circuits or systems complete.

Figure 3:
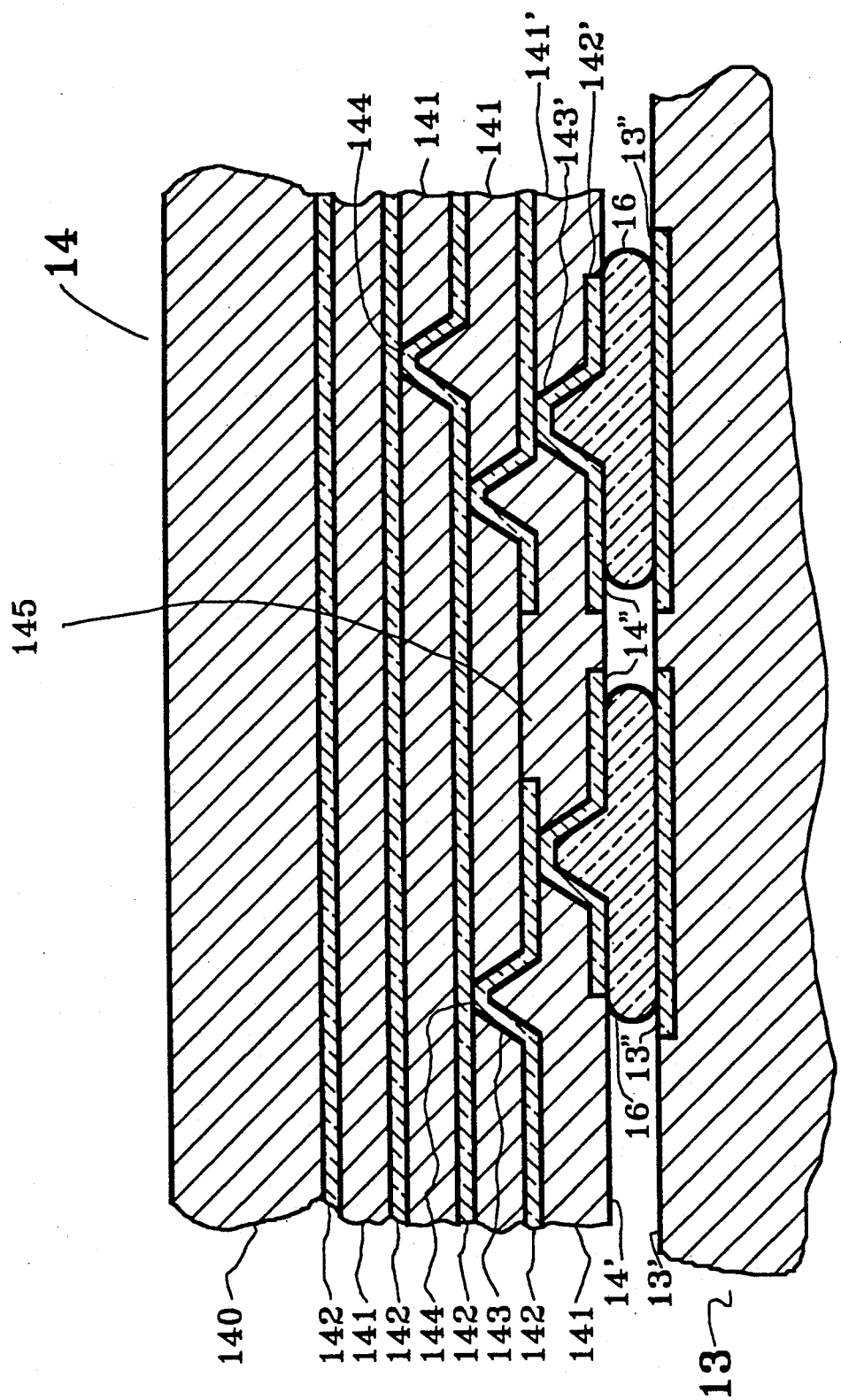
FIG. 3 shows a vertical cross-section of a broken-away portion of the interconnection arrangement in accordance with the invention herein.

FIG. 3 shows the detailed construction of interconnection arrangement 14, including bottom surface 14', electric surface terminations 14", a substrate 140, insulative layers 141, conductive layers 142, and vias 143 for interconnecting adjacent conductive layers 142, in partial vertical cross-sectional detail, particularly illustrating the plurality of layered conductive and insulative layers which form interconnection paths and regions to implement desired interconnection schemes between selected ones of bumps 16 and the electric surface terminations 13" in semiconductor chip 13. As shown in FIG. 3, interconnection arrangement 14 includes a plurality of insulative and conductive layers respectively 141 and 142 at successive levels within interconnection arrangement 14, fabricated according to techniques well known in the art. Conductive and insulative layers 141 and 142 are regionally patterned to establish conductive paths between respective ones of electric surface terminations 14" in the bottom surface 14' of the interconnection arrangement 14, effectively to guide the flow and application of electric currents and voltages, as needed to accomplish specific, desired electrical interconnections in semiconductor chip 13. The conductive layers 142 can be joined through vias 143 which extend through insulative layers 141 in the interconnection arrangement 14. In particular, at selected locations 144 in arrangement 14, the conductive layers 142 extend through adjacent insulative layers 141 to form electrical paths for establishing particular interconnections. FIG. 3 additionally shows a gap 145 between a selected conductive layer 142 at a predetermined level of interconnection arrangement 14, a technique which can be employed to ensure desired separation of multiple electrical paths between electric surface terminations 14" in interconnection arrangement 14.

As shown in FIG. 3, electrically conductive bumps 16 are formed on a lowest one of conductive layers 142, in particular conductive layer 142', which is provided with a localized coating of a barrier metal such as chromium, on the portions of the bottom surface 14' of interconnection arrangement 14 at which it is known that bumps 16 are desirably emplaced. The chromium material included in conductive layer 142' extends in a via 143' through the lowermost of insulative layers 141, that is layer 141', electrically to be able to communicate with respective solder bumps 16. Electrically conductive layer 142' may according to one version of the invention include tungsten or aluminum material, and the chromium included in layer 142' ensures that no leeching of solder in bumps 16 into conductive layer 142' will occur. Bumps 16 are interconnected with interconnection arrangement 14 along selected electrical paths defined within interconnection arrangement 14 through particular regions of conductive and insulative layers, 142 and 141, respectively. This permits electrical communication through bumps 16 and along selected paths in interconnection arrangement 14 through conductive layers 142 interconnected through one or more levels of insulative layers 141 to establish a desired interconnection scheme for incomplete circuits or systems in semiconductor chip 13.

FIG. 3 shows two bumps 16 respectively joined with first and second electrical surface terminations 14" in the bottom surface 14' of interconnection arrangement 14. It is understood that the paths in interconnection arrangement 14 may include a plurality of selected electric circuits and circuit components (e.g., capacitors and/or resistors) at one or more levels of interconnection arrangement 14. Thus the particular number of bumps 16 employed with interconnection arrangement 14 depends upon the particular interconnection arrangement scheme selected. A particular interconnection arrangement 14 may include any number of electrically conductive bumps 16, for electrical communion with electric surface terminations 13" in the top surface 13' of a semiconductor chip 13, as shown in FIG. 2, depending upon the number of electrical circuits, subcircuits, portions of circuits, circuit components, and circuit elements to be interconnected.

Interconnection arrangement 14 may contain multipolar circuit elements (e.g. transistors, resistors or capacitors), as well as complex interconnections which may themselves require more than merely two bumps 16 for electrical communication with a semiconductor chip 13, to be interconnected. Bumps 16 are particularly effective to engage electric surface terminations 13" and 14" in the respective top and bottom surfaces, 13' and 14', of semiconductor chip 13 and interconnection arrangement. 14. These electrical surface terminations 13" and 14" are manufactured in accordance with techniques well known to those skilled in the art to which this invention pertains. For example, plated metal ceramic techniques can be employed in the manufacture of interconnect arrangement 14. In accordance with this technique, interconnection arrangement 14 may thus respectively include a substrate 140 and insulating layers 141 of aluminum or aluminum nitride, and respective conductive layers 142 of tungsten or aluminum.

Interconnection arrangement 14 can further be manufactured according to well known techniques with a substrate 140 of silicon wafer, glass, sapphire, or ceramic material. In one instance, the insulative material used for insulative layers 144 can be of fabricated of silicon-oxide or polyamide material, for example. The material of conductive layers 142, according to a preferred version, can also be plated copper or aluminum, for example. If a multi-layer ceramic interconnection arrangement 14 is desired, then substrate 140 and insulative layers 141 are for example made of alumina or aluminum nitride material. The conductive material in conductive layers 142 is then tungsten material for example. Bumps 16 are preferably made of Pb-Sn solder material, which bonds particularly well to a local region which has been pretreated with a large concentration of chromium at the point of desired joinder, i.e., at respective electric terminations 13" and 14" to ensure effective bonding.

Mounting of the interconnection arrangement 14 in place upon the semiconductor chip 13 subject to interconnection is, for example, accomplished by positioning or placement of bumps 16 upon each of electric surface terminations 13" or 14", positioning interconnection arrangement 14 and electric surface terminations 14" over corresponding electric surface terminations 13", and heating the combination up to 300 to 400 degrees Celsius, for a suitable period of time until adjacent, cooperative electric surface terminations 13" and 14" are joined.

Use of this interconnection arrangement 14 and technique permits substantially increased circuit density on semiconductor chips 13 to be achieved. This scheme of interconnection saves considerably large areas of semiconductor chip real estate for fabrication of circuits, thereby endowing semiconductor chip 13 with increased functionality. According to the preferred version of the invention, a monolithic semiconductor chip interconnection arrangement 14 is thus established to accomplish desired interconnections in the circuitry of a semiconductor chip 13 which includes one or more incomplete electric circuits or systems of circuits.

The information above describes a version of the invention believed to be the best embodiment of the invention, but this information does not purport necessarily to define its scope. That is the purpose of the claims which follow:

What is claimed is:

1. An integrated circuit, comprising:
    a semiconductor chip having a top surface;
    an incomplete electrical circuit integrated within the semiconductor chip;
    a pair of electrical surface terminations in a contiguous area on the top surface, each such surface termination electrically connected to a separate portion of said incomplete electrical circuit;
    an interconnection chip having a bottom surface sized to fit within the contiguous area;
    a pair of electrically interconnected surface terminations on the bottom surface; and
    means for mounting the interconnection chip on the semiconductor chip within the contiguous area so that each termination on the bottom surface is electrically connected to one of the surface terminations on the top surface, whereby the interconnection chip serves to complete the electrical circuit in the semiconductor chip.

2. The integrated circuit claimed in claim 1, wherein the mounting means further comprises;
    bumps of electrically conducting material arranged for contact between surface terminations on the top and bottom surfaces.

3. The integrated circuit claimed in claim 2, wherein the surface terminations are treated to prevent leaching of the bump material.

4. The integrated circuit claimed in claim 2, wherein the bump material is solder.

* * * * *